(12) United States Patent
Li

(10) Patent No.: US 6,315,033 B1
(45) Date of Patent: Nov. 13, 2001

(54) HEAT DISSIPATING CONDUIT

(76) Inventor: Jia Hao Li, No. 2, Lane 127, Dang Ke St., Kang Shan Jen, Kao Hsiung Hsien (TW)

( * ) Notice: Subject to any disclaimer, the term of this patent is extended or adjusted under 35 U.S.C. 154(b) by 0 days.

(21) Appl. No.: 09/576,867

(22) Filed: May 22, 2000

(51) Int. Cl.$^7$ .................................................. F28D 15/00
(52) U.S. Cl. .................. 165/104.33; 165/185; 165/80.4; 361/697; 361/700; 361/709; 257/715; 174/16.3; 174/15.2
(58) Field of Search .................. 165/80.3, 80.4, 165/80.5, 185, 104.33, 104.26; 361/695, 700, 699, 689, 704; 174/15.1, 15.2, 16.3; 257/715, 716

(56) References Cited

U.S. PATENT DOCUMENTS

| | | | |
|---|---|---|---|
| 2,678,808 | * 5/1954 | Gier, Jr. ................................ | 165/185 |
| 3,942,586 | * 3/1976 | Fries ................................ | 165/104.26 |
| 4,724,901 | * 2/1988 | Munekawa ........................ | 165/104.21 |
| 4,763,722 | * 8/1988 | Piazzola ................................ | 165/185 |
| 5,647,430 | * 7/1997 | Tajima ................................ | 361/700 |
| 5,729,995 | * 3/1998 | Tajima ............................ | 165/104.33 |
| 5,924,481 | * 7/1999 | Tajima ............................ | 165/104.33 |
| 5,998,863 | * 12/1999 | Kobayashi et al. .................. | 257/715 |
| 6,026,890 | * 2/2000 | Akachi ............................ | 165/104.26 |

* cited by examiner

Primary Examiner—Ira S. Lazarus
Assistant Examiner—Terrell McKinnon
(74) Attorney, Agent, or Firm—Rosenberg, Klein & Lee

(57) ABSTRACT

A heat dissipating conduit of loop cross section and housing a heat dissipating fin plate. The heat dissipating fin plate is formed by continuously folding a thin plate and has folding pitch adapted with size of the heat dissipating conduit, whereby heat from a thermal source can be transmitted through arbitrary point on the heat dissipating conduit. The heat dissipating conduit can be connected pipe, heat pipe, connected heat pipe, flexible planar heat pipe or bubble-type circulation pipe. The contact area is increased and the heat dissipating effect is enhanced. The noise is reduced and the structure is more compact.

15 Claims, 19 Drawing Sheets

HEAT DISSIPATING CONDUIT

FIELD OF THE INVENTION

The present invention relates to a heat dissipating conduit, especially to a heat dissipating conduit, which has fast heat conducting effect along horizontal direction.

BACKGROUND OF THE INVENTION

The conventional heat dissipating apparatus of electronic device are generally designed for heat dissipation of CPU, i.e., for removing heat generated by the CPU out of the package. The heat dissipating apparatus become increasingly important as the speed of CPU increases. The conventional heat dissipating apparatus of electronic device can be classified to aluminum extrusion manifold type and heat pipe type. The aluminum extrusion manifold type heat dissipating apparatus comprises a bulky base integrally with a plurality of manifolds. The bulky base is in contact with electronic device requiring heat dissipation and the heat is dissipated only by the manifolds. The heat pipe type heat dissipating apparatus comprises a heat pipe connected with a plurality of heat dissipating plates. However, the heat dissipation is carried out only by the heat pipe and the heat dissipation is deteriorated when the heat pipe is slantingly arranged. Moreover, a multiple-plate composite heat dissipating apparatus is also proposed and much space is left for improvement.

It is the object of the invention to provide a heat dissipating conduit, which has fast heat conducting effect along horizontal direction. The contact area is increased and the heat dissipating effect is enhanced. The noise is reduced and the structure is more compact.

To achieve the above object, the present invention provides a heat dissipating conduit of loop cross section and housing a heat dissipating fin plate. The heat dissipating fin plate is formed by continuously folding a thin plate and has folding pitch adapted with size of the heat dissipating conduit, whereby heat from a thermal source can be transmitted through arbitrary point on the heat dissipating conduit. The heat dissipating conduit can be connected pipe, heat pipe, connected heat pipe, flexible planar heat pipe or bubble-type circulation pipe. The contact area is increased and the heat dissipating effect is enhanced. The noise is reduced and the structure is more compact.

The various objects and advantages of the present invention will be more readily understood from the following detailed description when read in conjunction with the appended drawing, in which:

DETAIL DESCRIPTION OF PREFERRED EMBODIMENT

Figure 1:
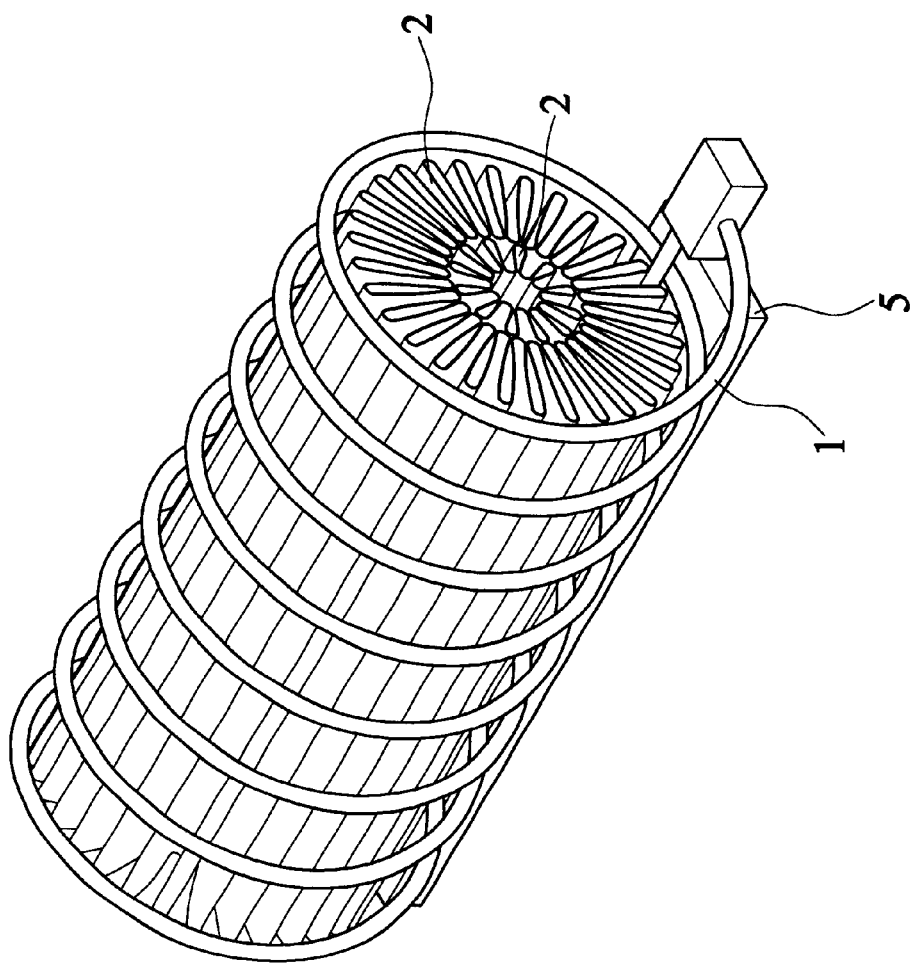
FIG. 1 is a perspective view of a heat dissipating conduit with a sparse pitch of the present invention.
Figure 2:
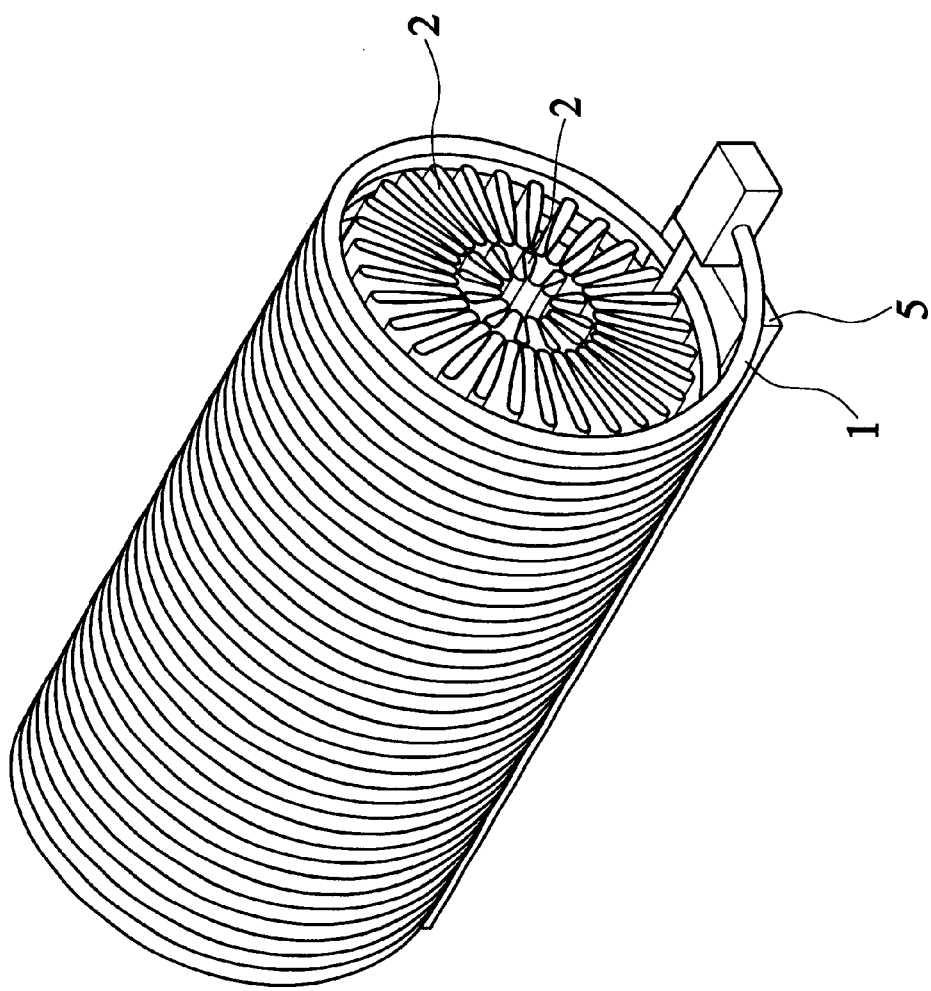
FIG. 2 is a perspective view of a heat dissipating conduit with a dense pitch of the present invention.
Figure 3:
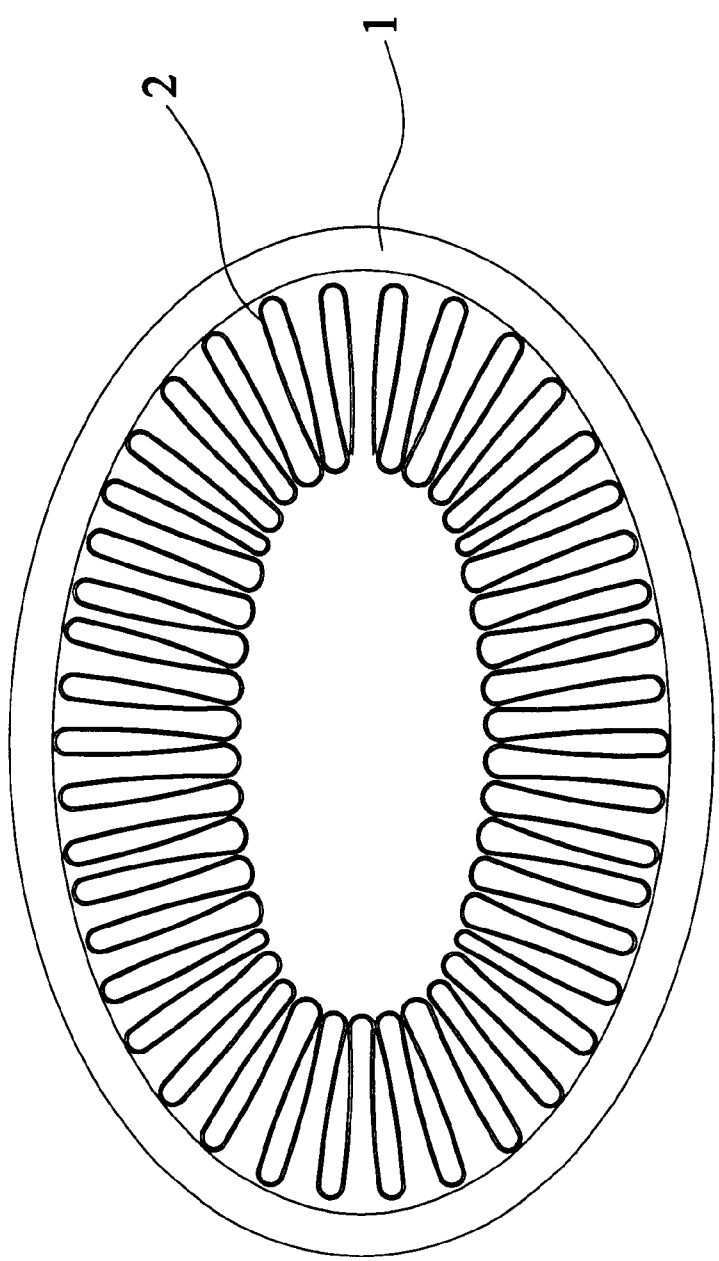
FIG. 3 shows a sectional view of an elliptical heat dissipating conduit of the present invention.
Figure 4A:
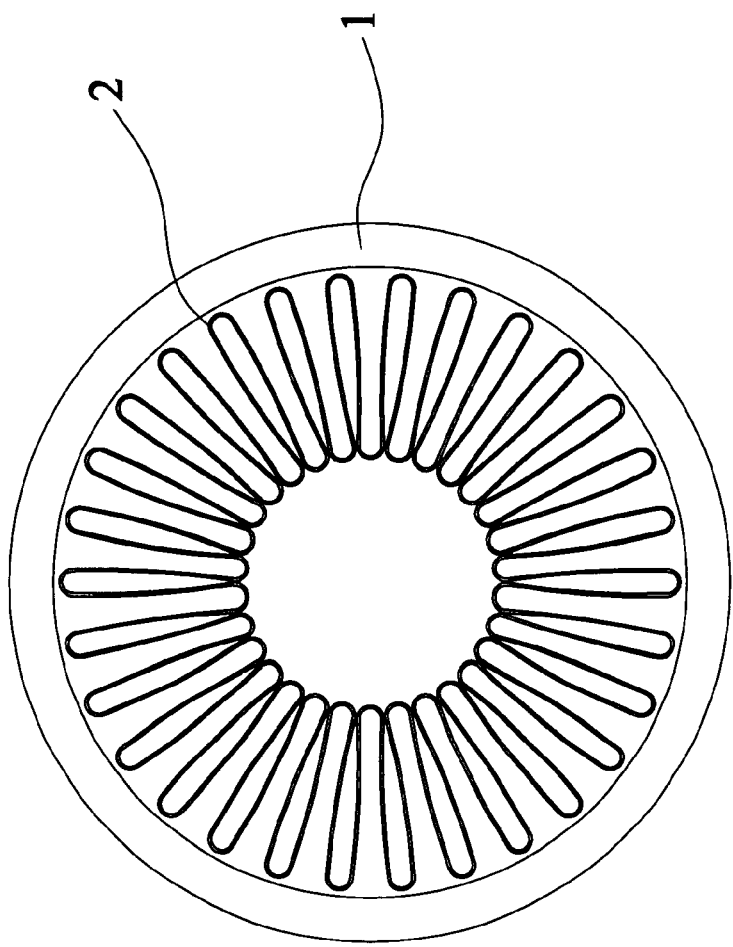
FIG. 4A shows a sectional view of a circular heat dissipating conduit with inner heat dissipating fin plate of the present invention.
Figure 4B:
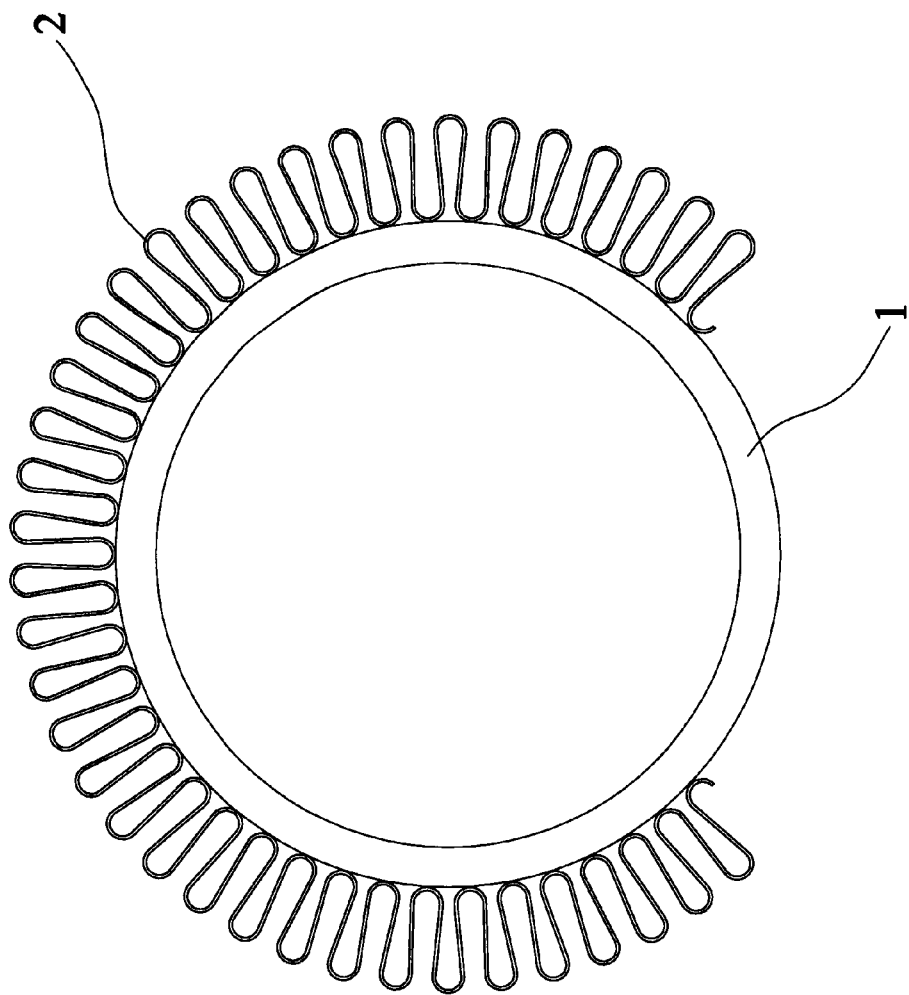
FIG. 4B shows a sectional view of a circular heat dissipating conduit with outer heat dissipating fin plate of the present invention.
Figure 4C:
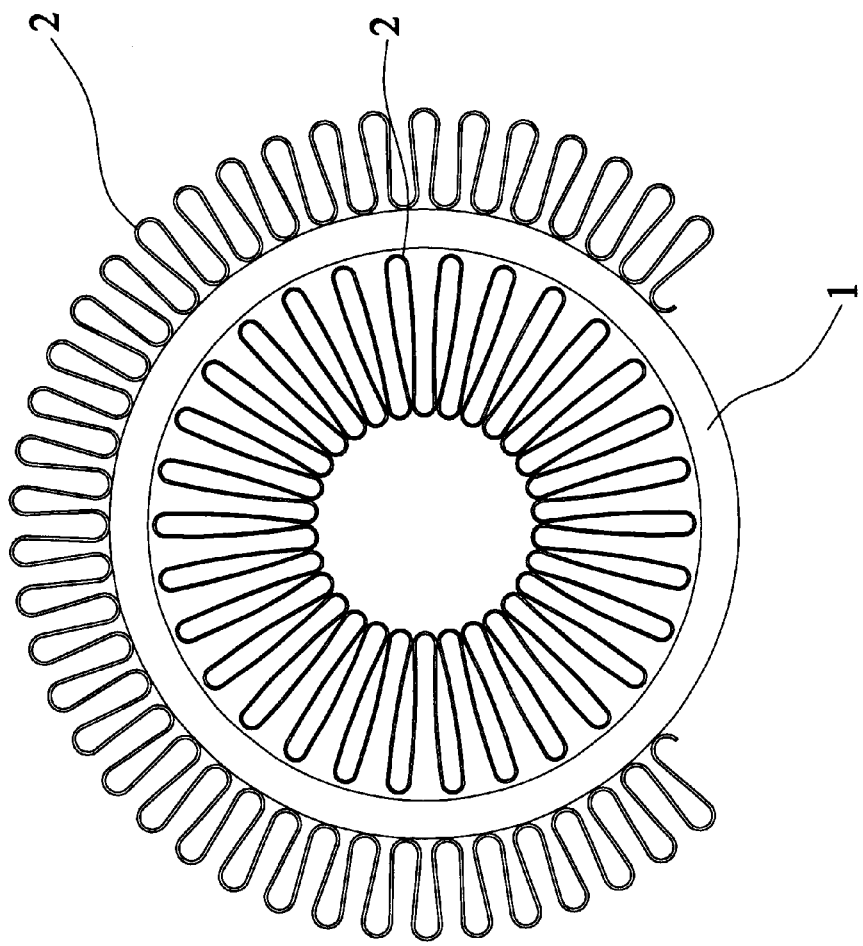
FIG. 4C shows a sectional view of a circular heat dissipating conduit with two heat dissipating fin plates of the present invention.
Figure 5:
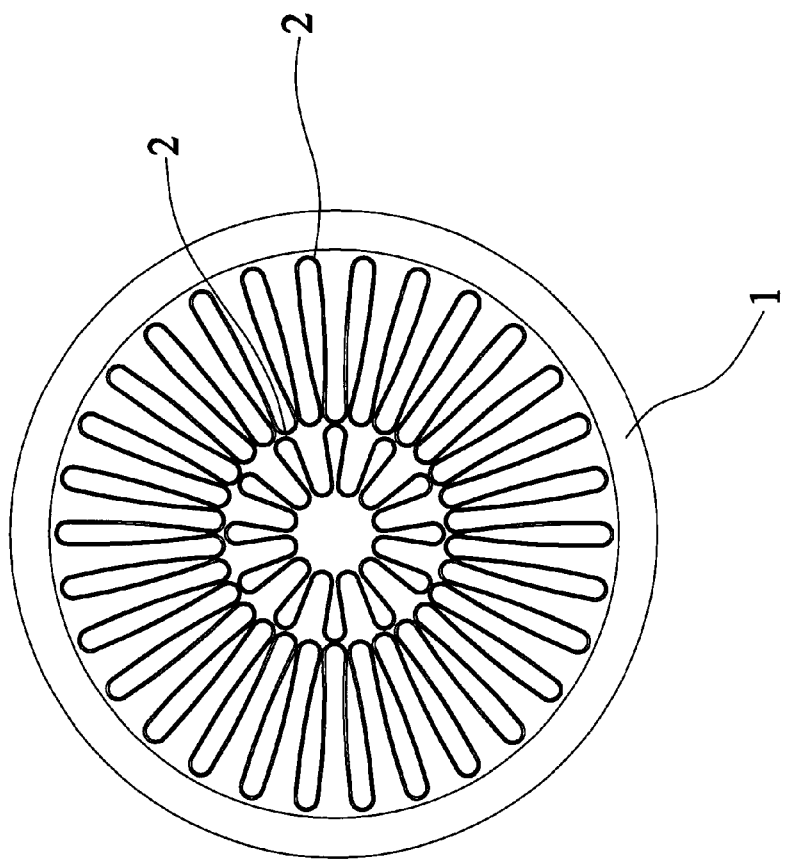
FIG. 5 is sectional view of a circular heat dissipating conduit with two inner heat dissipating fin plates of the present invention.
Figure 6:
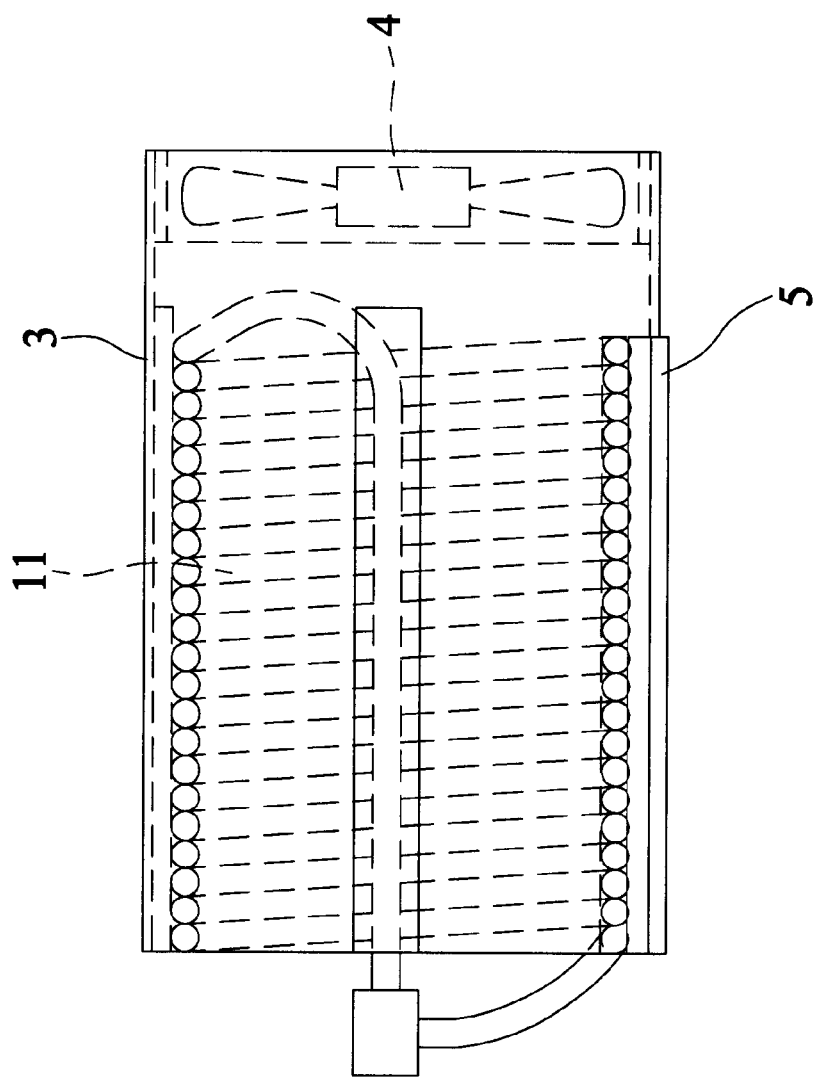
FIG. 6 is sectional view of a bubble-type circulation pipe of the present invention.
Figure 9A:
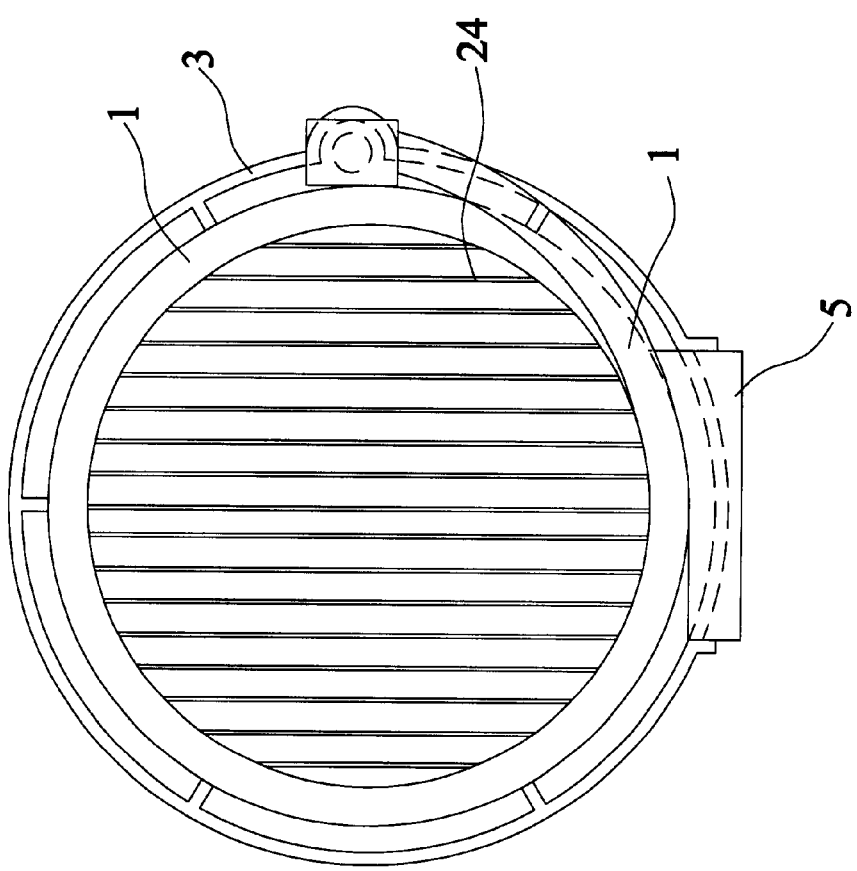
FIG. 9A shows a sectional view of a circular heat dissipating conduit with straight inner heat dissipating fin plate.
Figure 9B:
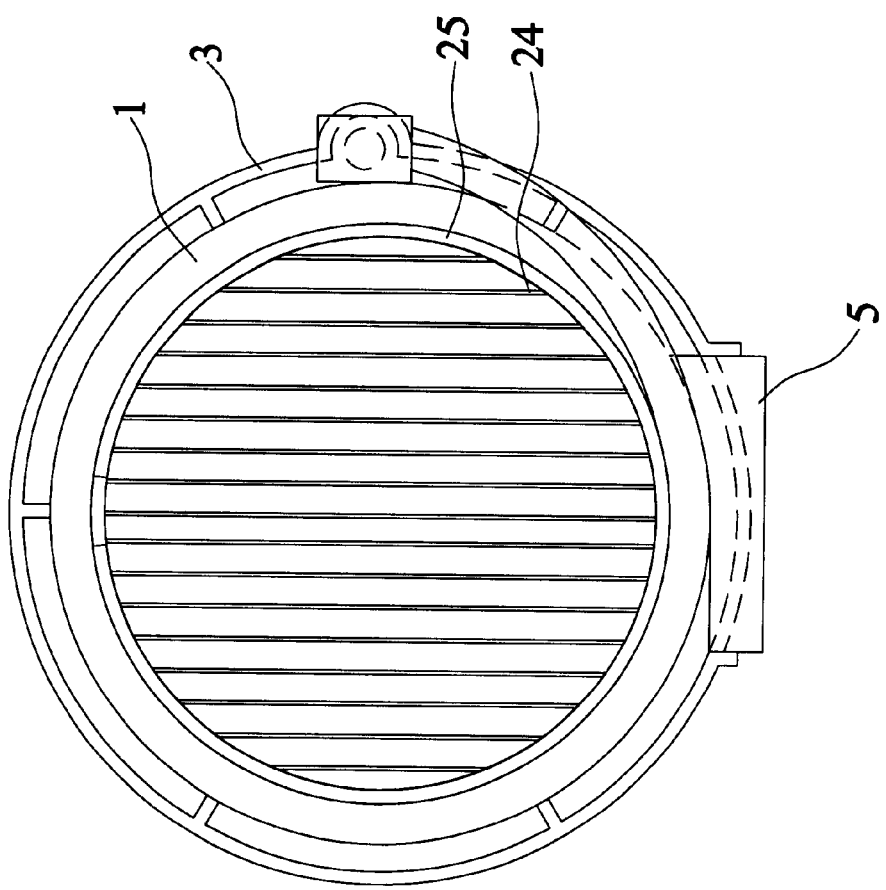
FIG. 9B is circular heat dissipating conduit of FIG. 9A with circular plate.
Figure 10:
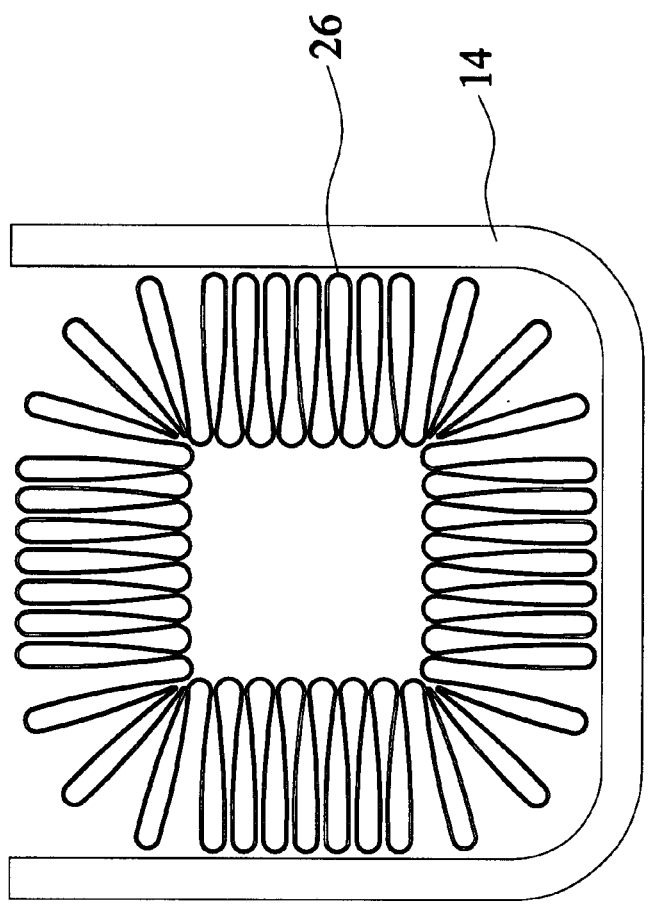
FIG. 10 is a sectional view showing U-shaped heat plate of the invention.

With reference now to FIGS. 1 to 11, the present invention is intended to provide a heat dissipating conduit, which has fast heat conducting effect along horizontal direction. The heat dissipating conduit 1 has a heat dissipating fin plate 2 arranged therein or around the perimeter thereof. The heat dissipating conduit 1 has loop cross section and the heat dissipating fin plate 2 arranged therein or around the perimeter thereof. As shown in FIG. 9, the heat dissipating fin plate 2 is formed by continuously folding a lengthwise plate and placed within the heat dissipating conduit 1. As shown in FIGS. 1 to 8, the heat dissipating fin plate 2 is formed by continuously folding a lengthwise plate and rolled and arranged within the heat dissipating conduit 1 or around the perimeter of the heat dissipating conduit 1. The heat dissipating conduit 1 has arbitrary loop cross section, such as elliptical shape as shown in FIG. 3, or circular shape as shown in FIG. 4. The heat dissipating conduit 1 can be embodied by heat pipe, connected heat pipe, flexible planar heat pipe as shown in FIG. 10, or bubble-type circulation pipe as shown in FIGS. 6 and 7. The folding pitch of the heat dissipating fin plate 2 is adapted with the size of the heat dissipating conduit 1. The heat dissipating conduit 1 can be used with a fan 4 and a wind hood 3 such that heat from thermal source can be conducted through the heat dissipating conduit 1 or the heat dissipating fin plate 2.

As shown in FIGS. 1 and 2, the heat dissipating conduit 1 is connected to a thermal source through a heat-conducting block 5. The thermal source can be, but not limited to, a CPU of computer. The heat-conducting block 5 is in contact with the heat dissipating conduit 1 such that heat from thermal source can be conducted through the heat dissipating conduit 1 and dissipated through the heat dissipating fin plate 2. FIG. 1 shows a heat dissipating conduit 1 with a sparse pitch and FIG. 2 shows a heat dissipating conduit 1 with a dense pitch.

FIGS. 3 to 5 show the structures of the heat dissipating fin plate 2. As shown in FIG. 3, the heat dissipating conduit 1 has elliptical shape cross section, and the heat dissipating fin plate 2 is arranged on inner surface of the heat dissipating conduit 1. As shown in FIG. 4A, the heat dissipating conduit 1 has circular shape cross section, and the heat dissipating fin plate 2 is arranged on inner surface of the heat dissipating conduit 1. This is the simplest configuration for embodiment. As shown in FIG. 4B, the heat dissipating fin plate 2 is arranged on outer perimeter of the heat dissipating conduit 1. As shown in FIG. 4C, the heat dissipating fin plates 2 are arranged both on inner surface and outer perimeter of the heat dissipating conduit 1. As shown in FIG. 5, two layers of the heat dissipating fin plates 2 are arranged on inner surface of the heat dissipating conduit 1.

Figure 7A:
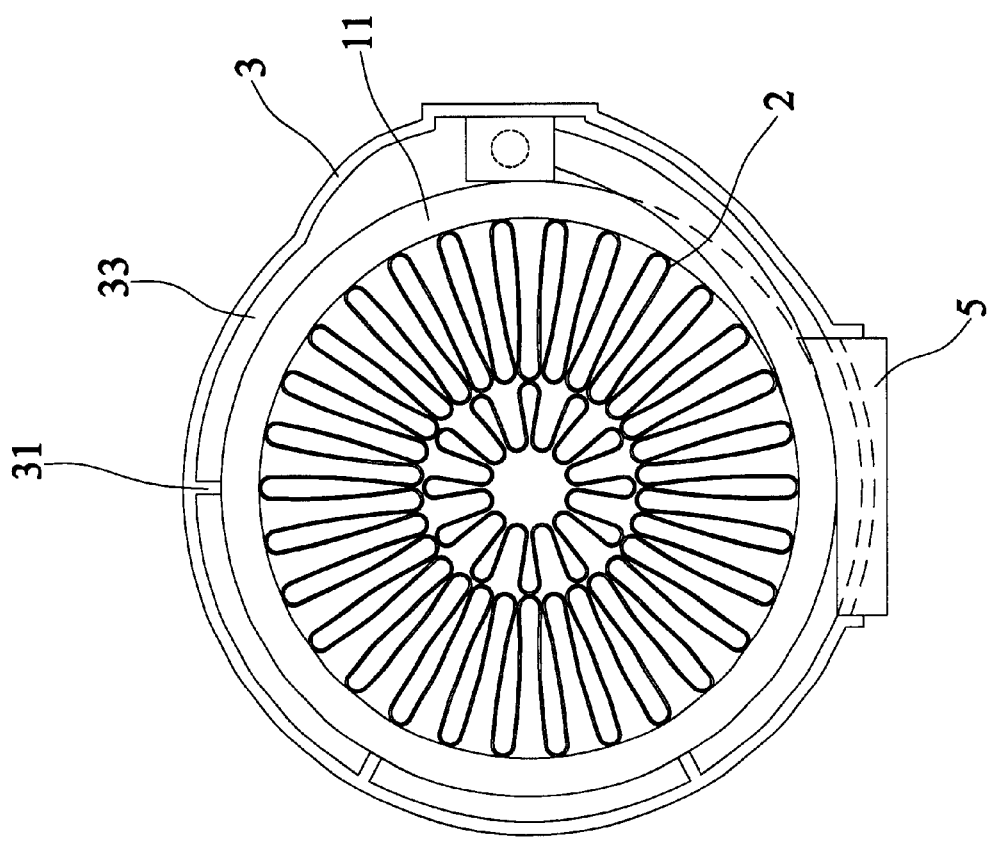
FIG. 7A is a left sectional view of FIG. 6.
Figure 7B:
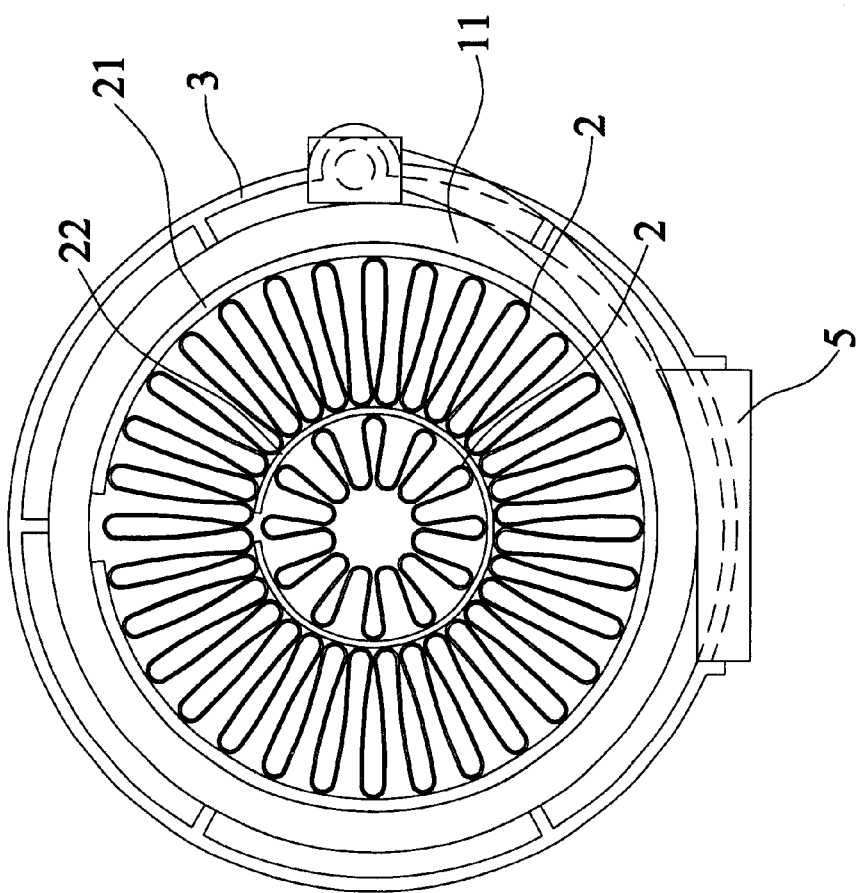
FIG. 7B is bubble-type circulation pipe of FIG. 7A with circular plate.
Figure 7C:
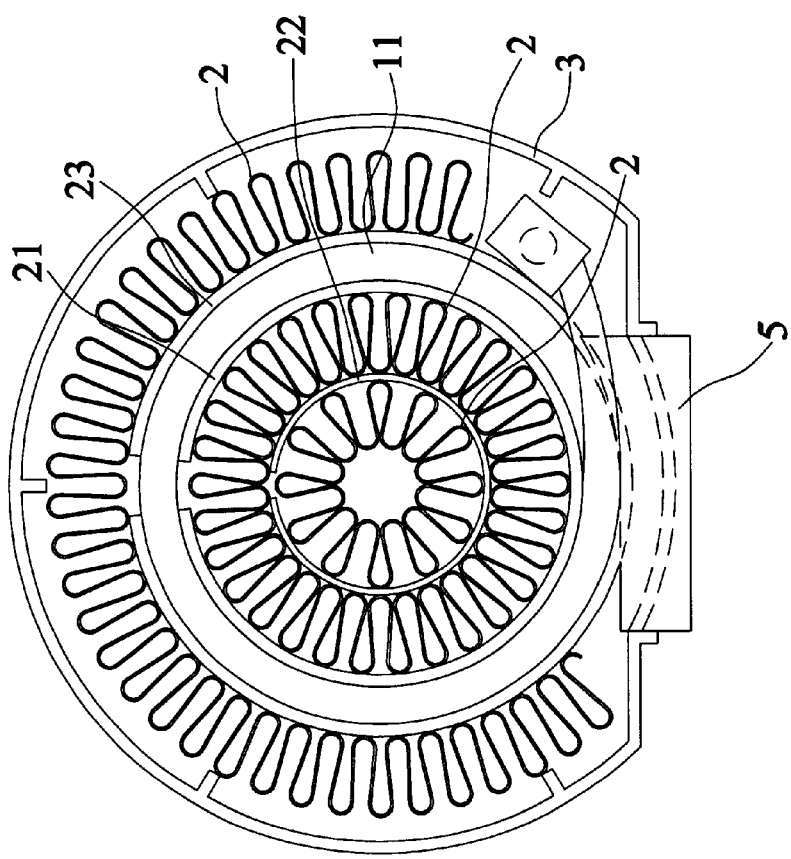
FIG. 7C is bubble-type circulation pipe of FIG. 7B with outer heat dissipating fin plate.

As shown in FIG. 6, a fan 4 is arranged beside the heat dissipating conduit 1 and the fan 4 is enclosed by a wind hood 3. The hood 3 has at least one inner projection 31 laying on the heat dissipating conduit 1 or the heat dissipating fin plates 2 such that a gap 33 is formed therebetween. The heat dissipating conduit 1 is embodied by a bubble-type circulation pipe 11 wherein the pipe is filled with liquid and a bubble is formed within the liquid. When being heated, the bubble within the bubble-type circulation pipe 11 will push the liquid to form circulation. FIG. 7A shows that the bubble-type circulation pipe 11 has two layer of the heat dissipating fin plates 2, similar to FIG. 5. As shown in FIG. 7B, a circular plate 21 is provided between the heat dissipating fin plate 2 and the bubble-type circulation pipe 11 to provide surface contact instead of original point contact. The circular plate 21 can further have slit (not shown) to retain the heat dissipating fin plate 2 and the bubble-type circulation pipe 11. Moreover, as shown in FIG. 7B, an inner circular plate 22 is provided between the heat dissipating fin plates 2. As shown in FIG. 7, an outer heat dissipating fin plate 2 is arranged around the perimeter of the bubble-type circulation pipe 11, and an outer circular plate 23 is provided between the outer heat dissipating fin plate 2 and the bubble-type circulation pipe 11 to provide surface contact.

Figure 8:
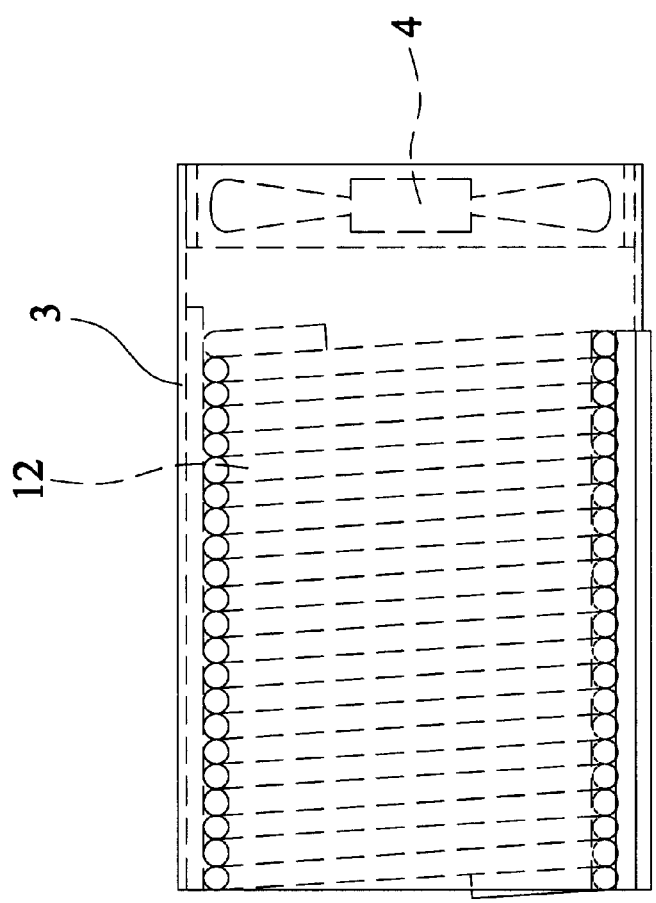
FIG. 8 is sectional view of a heat pipe of the present invention.
Figure 8A:
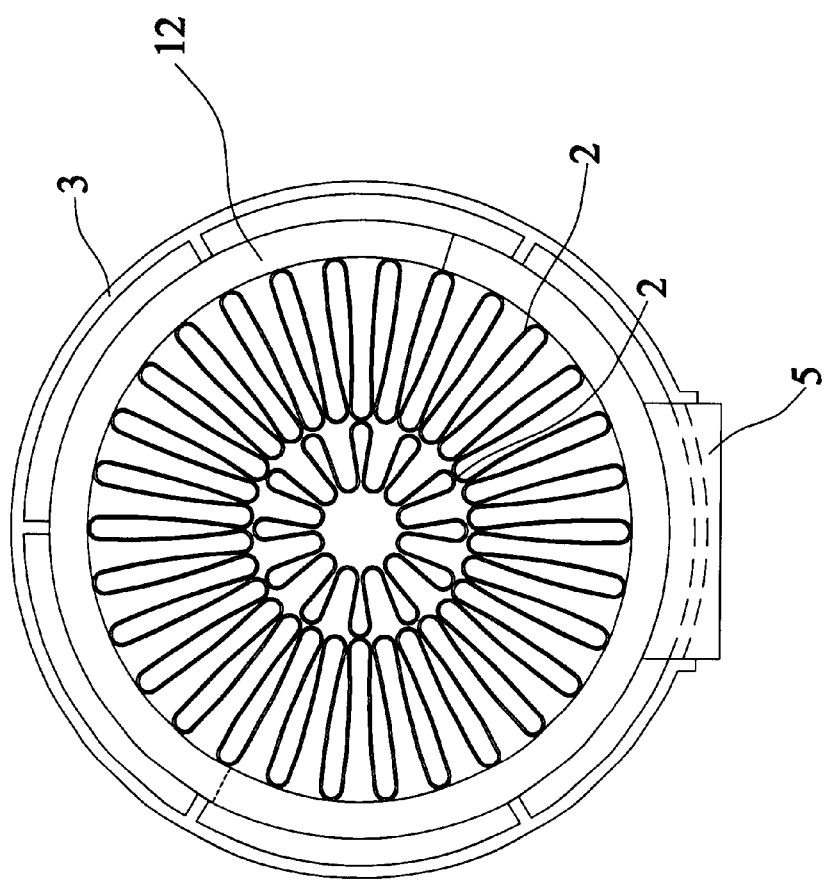
FIG. 8A is a left sectional view of FIG. 8.
Figure 8B:
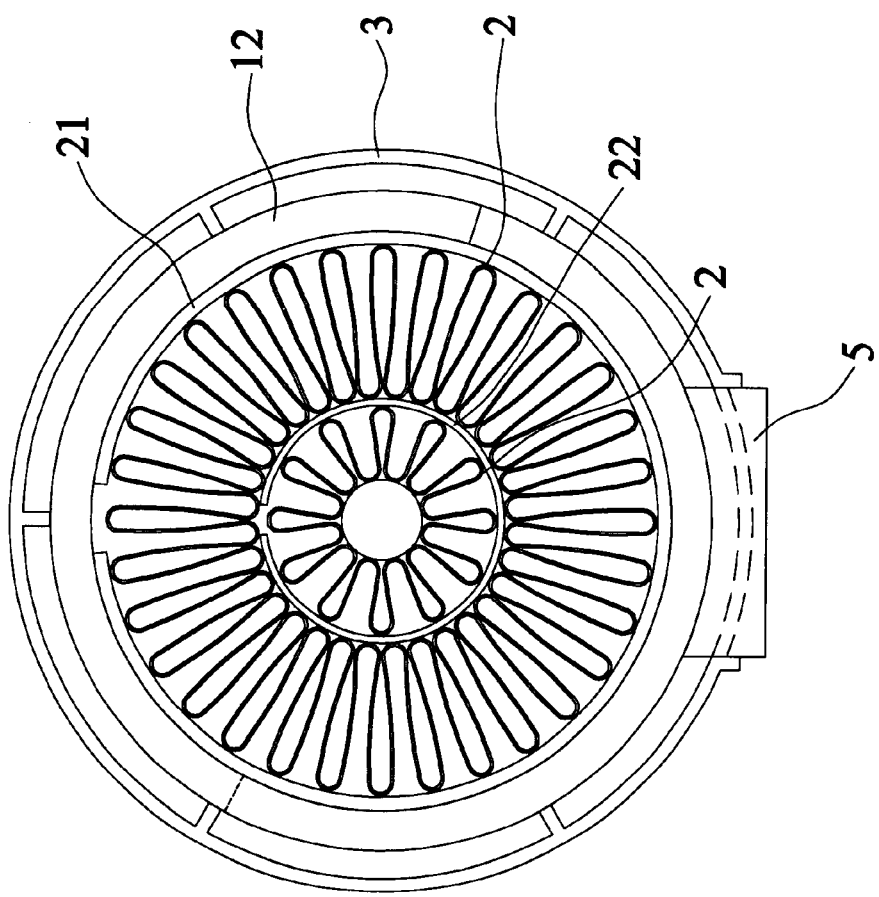
FIG. 8B is bubble-type circulation pipe of FIG. 8A with circular plate.
Figure 8C:
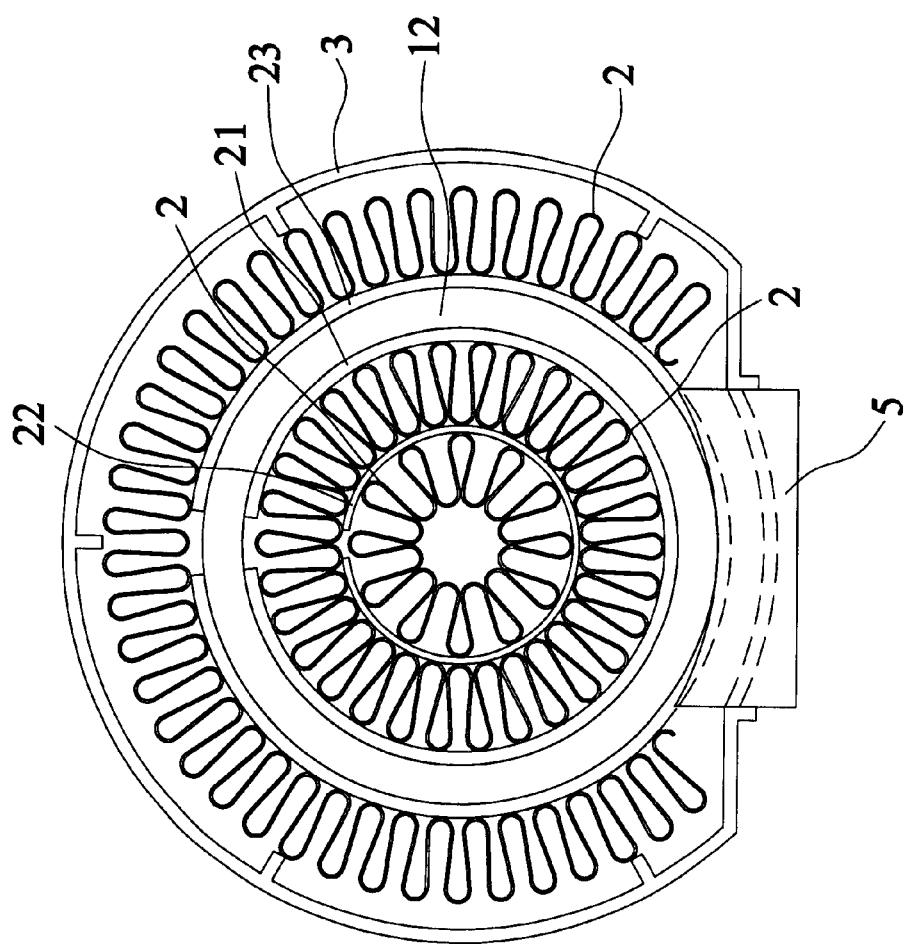
FIG. 8C is bubble-type circulation pipe of FIG. 8B with outer heat dissipating fin plate.

As shown in FIG. 8, the bubble-type circulation pipe 11 is replaced by a wrapped heat pipe 12. The configurations shown in FIGS. 8A to 8C are corresponding to the configurations shown in FIGS. 7A to 7C.

Figure 11:
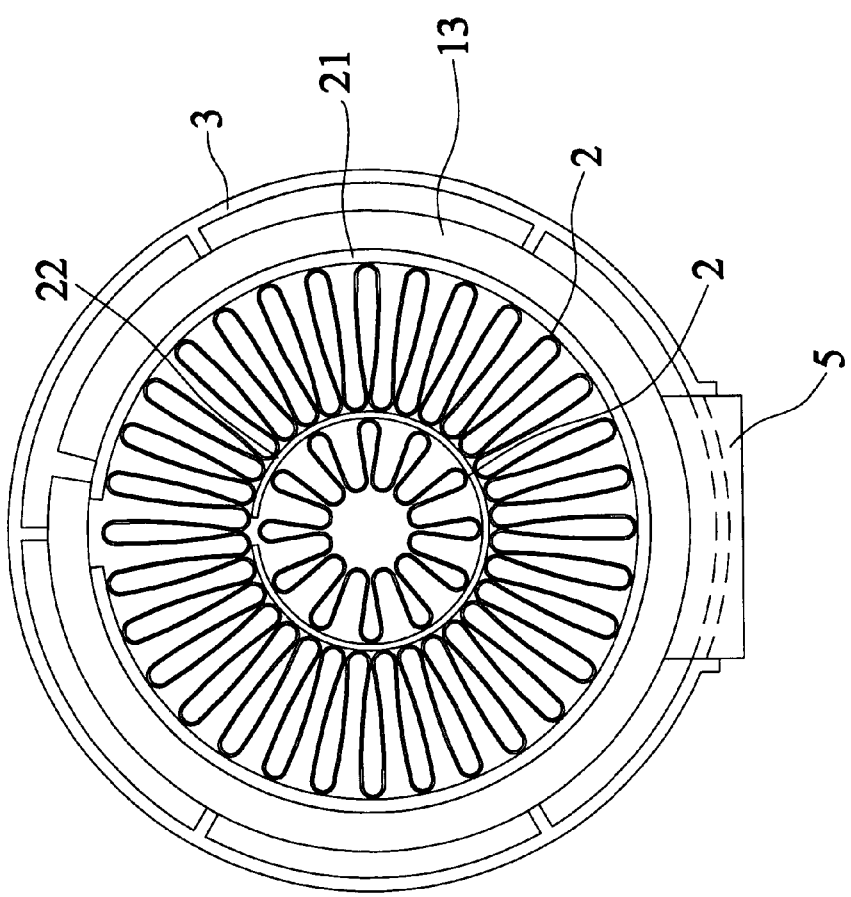
FIG. 11 is a sectional view showing heat plate with circular plate.

As shown in FIG. 9A, the heat dissipating fin plate 24 can be formed by folding a plate of varied width and inserted into the heat dissipating conduit 1. As shown in FIG. 9B, a circular plate 25 is provided between the heat dissipating fin plate 24 and the heat dissipating conduit 1 to provide surface contact. As shown in FIG. 10, the heat dissipating conduit 1 is replaced by a U-shaped heat plate 14 and the heat dissipating fin plate 26 is also in loop configuration. As shown in FIG. 11, a circular plate 21 is provided between the heat dissipating fin plate 2 and the heat dissipating conduit 13 to provide surface contact.

To sum up, in the present invention, the heat dissipating conduit is provided with folded heat dissipating fin plate on inner surface or outer perimeter thereof. The contact area is increased and the heat dissipating effect is enhanced. The noise is reduced and the structure is more compact.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A heat dissipating conduit system, comprising:

a heat dissipating fin plate formed by continuously folding a thin plate into a loop shape of at least one turn, the loop shaped heat dissipating fin plate having a through hole formed in a center portion thereof; and, a heat dissipating conduit formed around the heat dissipating fin plate and having a loop cross-section, the heat dissipating conduit being adapted for contact with a thermal source at an arbitrary location.

2. The heat dissipating conduit as in claim 1, wherein a portion of the heat dissipating conduit passes through the through hole of the heat dissipating fin plate.

3. The heat dissipating conduit as in claim 1, wherein a plate having a circular cross-sectional contour is provided between the heat dissipating fin plate and the heat dissipating conduit.

4. A heat dissipating conduit system, comprising:

a first heat dissipating fin plate formed by continuously folding a thin plate;

a heat dissipating conduit formed around the first heat dissipating fin plate and having a loop cross-section, the heat dissipating conduit being adapted for contact with a thermal source at an arbitrary location;

a second heat dissipating fin plate formed by continuously folding a thin plate and disposed around the heat dissipating conduit; and, a wind hood located adjacent the heat dissipating conduit, the wind hood having an inner projection laying on the heat dissipating conduit.

5. The heat dissipating conduit as in claim 4, wherein a plate having a circular cross-sectional contour is provided between the second heat dissipating fin plate and the heat dissipating conduit.

6. The heat dissipating conduit as in claim 4, wherein a fan is provided within the wind hood adjacent the heat dissipating conduit.

7. A heat dissipating conduit structure for removing heat from a heat source coupled to a longitudinally extended heat-conducting block, comprising:

a heat dissipating fin plate formed of a continuously folded plate arranged in a substantially closed contour; and, a heat dissipating conduit helically wound around an outer perimeter of said heat dissipating fin plate to form a plurality of longitudinally arranged coils, each of said coils having a portion thereof in contact with the heat-conducting block.

8. The heat dissipating conduit structure as recited in claim 7, wherein said heat dissipating conduit is formed from a structure selected from the group consisting of a connected pipe, a heat pipe, a flexible planar heat pipe, and a bubble-type circulation pipe.

9. The heat dissipating conduit structure as recited in claim 7, wherein said closed contour of said heat dissipating fin plate has a longitudinally directed hole formed therethrough and a portion of said heat dissipating conduit passes through said hole.

10. The heat dissipating conduit structure as recited in claim 7 further comprising a plate having a circular cross-sectional contour disposed between said heat dissipating fin plate and said heat dissipating conduit.

11. The heat dissipating conduit structure as recited in claim 7, wherein said folded plate is folded to form first folds adjacent said heat dissipating conduit and second folds distally from said heat dissipating, said first folds being of larger dimension than said second folds.

12. The heat dissipating conduit structure as recited in claim 11 further comprising a plate having a circular cross-sectional contour disposed between said heat dissipating fin plate and said heat dissipating conduit.

13. The heat dissipating conduit structure as recited in claim 7 further comprising a second heat dissipating fin plate formed of a continuously folded plate and overlaying said heat dissipating conduit.

14. The heat dissipating conduit structure as recited in claim 13 further comprising a second plate having a circular cross-sectional contour disposed between said heat dissipating conduit and said second heat dissipating fin plate.

15. The heat dissipating conduit structure as recited in claim 13 further comprising (a) a wind hood disposed adjacent one end of said plurality of longitudinally arranged coils of said heat dissipating conduit, said wind hood having an inner projection extending therefrom to contact said heat dissipating conduit, and (b) a fan housed within said wind hood.

* * * * *